United States Patent
Huang et al.

(10) Patent No.: US 10,594,224 B2
(45) Date of Patent: Mar. 17, 2020

(54) SWITCH MODE POWER SUPPLY FOR CONTINUOUS CONDUCTION MODE OPERATION

(71) Applicant: DIODES INCORPORATED, Plano, TX (US)

(72) Inventors: Pin-Hao Huang, New Taipei (TW); Chengfu Chang, Keelung (TW); Chuante Liu, Keelung (TW)

(73) Assignee: DIODES INCORPORATED, Plano, TX (US)

( * ) Notice: Subject to any disclaimer, the term of this patent is extended or adjusted under 35 U.S.C. 154(b) by 0 days.

(21) Appl. No.: 15/991,919

(22) Filed: May 29, 2018

(65) Prior Publication Data
US 2019/0372472 A1 Dec. 5, 2019

(51) Int. Cl.
| | | |
|---|---|---|
| H02M 3/335 | (2006.01) | |
| H01L 27/06 | (2006.01) | |
| H01L 29/872 | (2006.01) | |
| H02M 3/156 | (2006.01) | |

(52) U.S. Cl.
CPC .... *H02M 3/33592* (2013.01); *H01L 27/0629* (2013.01); *H01L 29/872* (2013.01); *H02M 3/156* (2013.01); *H02M 3/3353* (2013.01)

(58) Field of Classification Search
None
See application file for complete search history.

(56) References Cited

U.S. PATENT DOCUMENTS

| | | | | |
|---|---|---|---|---|
| 6,421,262 B1* | 7/2002 | Saxelby | ............... | H01L 24/40 363/127 |
| 2002/0141214 A1* | 10/2002 | Grover | ............. | H02M 3/33592 363/125 |
| 2005/0254266 A1* | 11/2005 | Jitaru | ............... | H02M 3/33523 363/16 |
| 2006/0171180 A1* | 8/2006 | Kyono | ............ | H02M 3/33592 363/95 |
| 2014/0233272 A1* | 8/2014 | Fang | ................ | H02M 3/33592 363/21.14 |
| 2015/0326008 A1* | 11/2015 | Baurle | ................ | H02H 1/0084 361/87 |
| 2016/0049876 A1* | 2/2016 | Lee | ................... | H02M 3/33592 363/20 |
| 2017/0155335 A1 | 6/2017 | Chang et al. | | |
| 2017/0222569 A1* | 8/2017 | Choi | .................... | H02M 1/088 |
| 2018/0287506 A1* | 10/2018 | Gadler | ................. | H02M 7/217 |

OTHER PUBLICATIONS

Mappus, S. "Synchronous Rectification for Forward Converters." Fairchild Semiconductor Power Seminar 2010-2011. Published 2010. 19 pages.
Wong A. "Energy Star V2.0 Compliant Flyback Converter Using the ZXGD3101 Synchronous MOSFET Controller." Diodes Incorporation, Issue 4. Published Mar. 2011. 10 pages.

* cited by examiner

*Primary Examiner* — Jeffrey A Gblende

(57) ABSTRACT

A two-terminal rectifier includes a power MOSFET, a body diode, and a Schottky diode coupled between the first terminal and the second terminal. The two-terminal rectifier also has a power management circuit, a capacitor, a control circuit, and a driver circuit coupled between the first terminal and the second terminal. The two-terminal rectifier can be implemented in a two-pin package and can be used in a power converter for CCM operation.

18 Claims, 8 Drawing Sheets

SWITCH MODE POWER SUPPLY FOR CONTINUOUS CONDUCTION MODE OPERATION

BACKGROUND OF THE INVENTION

The present invention relates generally to power supply controllers. More particularly, the present invention relates to synchronous rectifiers (SR) used in a power converter to simplify circuit design and improve power efficiency.

Switching mode power control techniques have found wide applications in computer and electronic equipment power supplies. The popularity of switching mode power supplies (SMPS) are, in part, due to their compactness, stability, efficiency, and lower cost, compared to traditional linear transformer circuits.

The flyback converter is one of the common topologies among the numerous varieties of power converters. A typical flyback converter includes a transformer having a primary winding and a secondary winding, and sometimes a third or more windings for control purposes. This transformer provides a galvanic isolation between the input and the output, and is often used in low-power low-cost power supplies.

In order to provide a DC voltage, diode rectification has been used for many years in switching mode power supplies. However, the scaling down of semiconductor technology calls for lower voltage and larger current power supply. While the diode forward drop voltage cannot be scaled down further, diode rectification can no longer meet the smallness, thinness, and high-efficiency requirements desired by the consumer. Furthermore, diode rectification suffers from excessive loss with large output current.

As a result, synchronous rectification methods using a synchronous rectifier (SR), with a power MOSFET, have been used to replace the diode. Even though widely used, conventional synchronous rectifiers suffer from many limitations. More details of these and other limitations are described below.

Therefore, there is a need for methods and systems for improved synchronous rectifiers.

BRIEF SUMMARY OF THE INVENTION

The inventor has recognized that the conventional synchronous rectifier often requires a separate control IC and supporting circuit elements, and can still suffer from drawbacks from body diode conduction and stored charges. Even though a Schottky diode can be connected in parallel with the MOSFET, such an arrangement still requires several separate ICs, complicating the design and increasing the cost. The inventor has also recognized that power controller designs for CCM (continuous conduction mode) operation are more complicated than for DCM (discontinuous conduction mode) operation, and often require hand-shake signals, e.g., a CCM synchronization signal, between the primary side and the secondary side. In some cases, an extra pin (e.g., a sync pin) in the secondary controller is needed for CCM operation. Some controllers may perform CCM operation without a sync pin, but they require complicated controllers and several separate ICs, which can make system design more difficult and increase the cost.

This invention teaches a two-terminal rectifier that includes a power MOSFET, a Schottky diode, a capacitor, and control circuitry in a single two-pin package. The two-terminal rectifier can be used as a drop-in replacement for a conventional diffusion diode or a conventional synchronous rectifier in a power converter. A simple control method for CCM operation enabled by the two-terminal rectifier is also described.

For example, an exemplary two-terminal rectifier can include a first terminal and a second terminal configured for coupling between a transformer and an output terminal of a power converter. The two-terminal rectifier can also have a power switch coupled to the first terminal and the second terminal for turning on and off current flow between the first terminal and the second terminal. As an example, the power switch can include a power MOSFET having a source, a drain, a gate, and a body. Further, a body diode is formed by a junction between the body and the drain of the power MOSFET or by a junction between the body and the source of the power MOSFET, and the body diode is coupled in parallel to the source and drain of the power switch. A Schottky diode is coupled to the first terminal and the second terminal. The two-terminal rectifier can also have a power management circuit and a capacitor coupled between the first terminal and the second terminal for providing operating power to the two-terminal rectifier. A control circuit is coupled to the power management circuit and provides a control signal for controlling an on/off state of the power MOSFET in response to a voltage between the drain and the source of the power switch. A driver circuit is coupled to the control circuit to receive the control signal and to provide a driving signal to the gate of the power MOSFET. The two-terminal rectifier is configured to reduce body diode current conduction during a dead time in the power converter and to reduce reverse recover time in the body diode for continuous conduction mode (CCM) operation of the power converter. The two-terminal rectifier includes a control circuit to adjust a dead time for continuous conduction mode (CCM) operation of the power converter for improved efficiency.

The two-terminal rectifier can be implemented in a single two-pin package which can include a lead frame having a first chip mount pad, a second chip mount pad, a first lead segment coupled to the first chip mount pad, and a second lead segment coupled to the second chip mount pad. A first semiconductor chip for the power switch is attached to the first chip mount pad, with the drain of the power switch coupled to the first lead segment through the first chip mount pad. A second semiconductor chip for the Schottky diode is attached to the first chip mount pad, with a cathode of the Schottky diode coupled to the first lead segment through the first chip mount pad. A third semiconductor chip, which can include the power management circuit, the control circuit, and the driver circuit, is attached to the second chip mount pad. The capacitor is attached to the second chip mount pad, with a first end of the capacitor coupled to second lead segment through the second chip mount pad and a second end of the capacitor coupled to the power management circuit in the third semiconductor chip. The two-pin package can include a first conductive connection coupling an output pin of the third semiconductor chip to the gate of the power switch, a second conductive connection coupling an anode of the Schottky diode to the first chip source of power switch, and a third conductive connection connecting the source of the power switch to the second chip mount pad.

DEFINITIONS

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called double-diffused MOS or simply DMOS.

A body diode in a power MOSFET is formed when the body and source are coupled together, and the body diode is formed between drain and source. The diode between the drain (cathode) and the source (anode) of the MOSFET, making it able to block current in only one direction.

A Schottky diode is a semiconductor diode formed by the junction of a semiconductor with a metal. It has a low forward voltage drop and a fast switching action.

A power converter is an electrical or electro-mechanical device for converting electrical energy, such as converting between AC and DC or changing the voltage, current, or frequency, or some combinations of these conversions. A power converter often includes voltage regulation.

A regulator or voltage regulator is a device for automatically maintaining a constant voltage level.

A switching regulator, or switch mode power supply (SMPS), uses an active device that switches on and off to maintain an average value of output. In contrast, a linear regulator is made to act like a variable resistor, continuously adjusting a voltage divider network to maintain a constant output voltage, and continually dissipating power.

A constant-current regulator is a regulator that provides a constant output current. A constant current or constant voltage is understood to be a current or voltage that maintains a constant value with a range of deviation depending on design and manufacturing process variations or within a limitation according to a specification, for example, within ±10%, ±5%, or ±1%.

A diode forward voltage is the voltage dropped across a conducting, forward-biased diode. For example, silicon P-N junction diodes can have a forward voltage of approximately 0.7 volts, depending on the doping concentration in the P and N regions.

An operational amplifier (op-amp or opamp) refers to a DC-coupled high-gain electronic voltage amplifier with a differential input and, usually, a single-ended output. An operational amplifier can be characterized by a high input impedance and a low output impedance, and can be used to perform mathematical operations in analog circuits.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

A lead frame is a thin layer of metal frame to which semiconductor die is attached during the package assembly process. A lead frame can be encapsulated inside a chip package that carries signals from the die to the outside.

When the term "the same" is used to describe two quantities, it means that the values of two quantities are determined the same within measurement limitations.

DETAILED DESCRIPTION OF THE INVENTION

Figure 1:
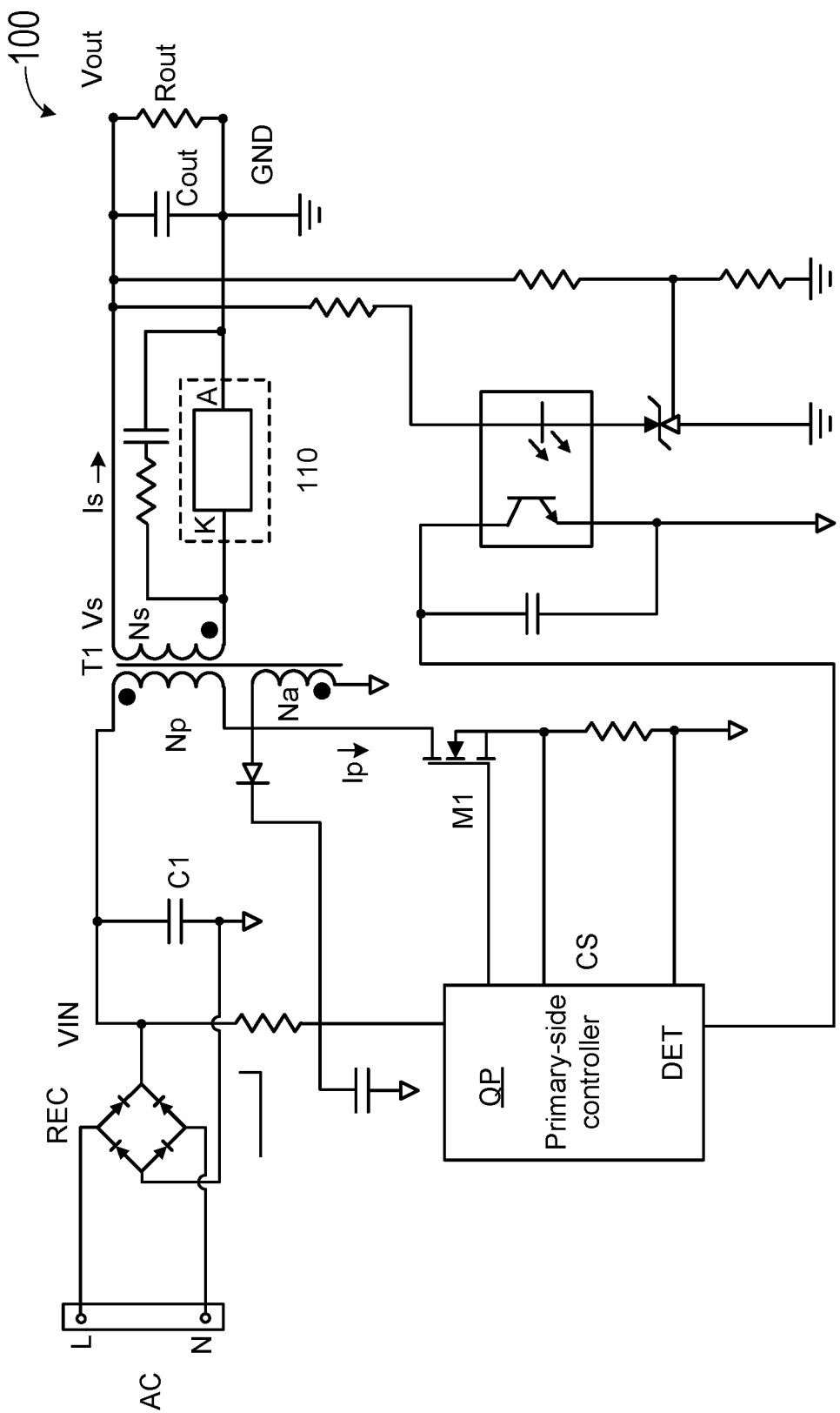
FIG. 1 is a simplified schematic diagram of a power converter, for example, a switch mode power supply (SMPS) that embodies certain aspects of this invention.

FIG. 1 is a simplified schematic diagram of a power converter, for example, a switch mode power supply (SMPS), that embodies certain aspects of this invention. As shown in FIG. 1, SMPS 100 is in a flyback converter topology for regulating an output voltage Vout. SMPS 100 includes a transformer T1 that has a primary winding Np coupled in series to a power transistor M1, which is typically a power MOSFET or a power BJT, a secondary winding Ns, and an auxiliary winding Na. In FIG. 1, Np, Ns, and Na also designate the turn ratio in the respective windings. The primary winding is for coupling to an alternating power source AC through a rectifying circuit REC that includes a diode bridge formed by four diodes and a capacitor C1. The rectifying circuit provides rectified DC power VIN to the SMPS. The secondary winding Ns is configured for providing an output Vout to a load device represented by a resistor Rout. Power transistor, also referred to as power switch, M1 is coupled to primary winding Np for controlling the current flow in the primary winding. A primary side controller circuit QP is configured to receive a detection signal through a DET input terminal and a current sense signal through a CS input terminal. Primary side controller circuit QP is configured to turn on and turn off power transistor M1 to regulate the SMPS. When power transistor M1 is turned on, a primary current Ip builds in primary winding Np, which stores energy. The energy stored in primary winding Np is transferred to secondary winding Ns to induce a secondary current Is during a turn-off time interval of power transistor M1. A two-terminal rectifier 110 and a snubber capacitor Cout are coupled to secondary winding Ns and configured to convert a secondary voltage Vs into a DC system voltage Vout to supply to a load device, represented by resistor Rout in FIG. 1.

In FIG. 1, two-terminal rectifier 110 includes an anode (A) and a cathode (K) and allows current to flow from the anode to the cathode. Two-terminal rectifier 110, together with capacitor Cout, form a rectifier circuit to convert secondary voltage Vs to a DC output Vout.

Figure 2:
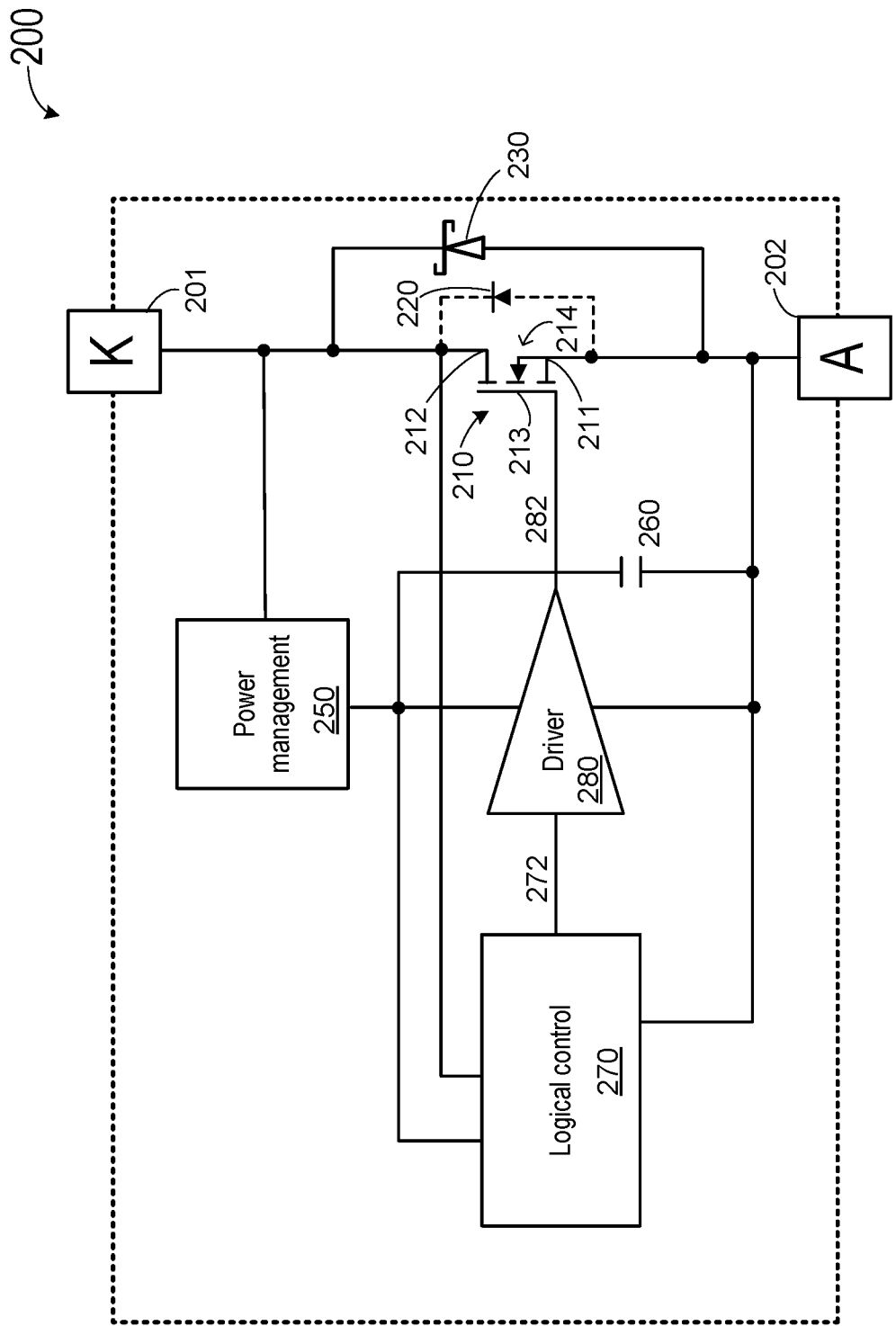
FIG. 2 is a simplified block diagram of a two-terminal rectifier 200 for a power converter that embodies certain aspects of this invention.

FIG. 2 is a simplified block diagram of a two-terminal rectifier 200 for a power converter that embodies certain aspects of this invention. Two-terminal rectifier 200 is an example of a rectifying element that can be used as the two-terminal rectifier 110 in FIG. 1. In FIG. 2, two-terminal rectifier 200 includes an anode A and a cathode K that allows current to flow from the anode to the cathode. In the configuration of FIG. 1, the cathode K of two-terminal rectifier 110 is coupled to the secondary winding of the transformer, and the anode A of two-terminal rectifier 110 is coupled to an output terminal of the power converter, which in this case is a ground terminal. In another configuration, two-terminal rectifier 110 can have the cathode K coupled to the Vout terminal and the anode A coupled to the secondary winding of the transformer. In general, two-terminal rectifier 200 can have a first terminal for coupling to a transformer of the power converter and a second terminal for coupling to an output terminal of the power converter. In FIG. 2, a terminal 201 is the cathode labeled "K", and a terminal 202 is the anode labeled "A".

Two-terminal rectifier 200 also has a power switch 210 coupled to the first terminal and the second terminal of the two-terminal rectifier 200. In this example, power switch 210 is a four-terminal MOSFET having a source 211, a drain 212, a gate 213, and a body 214. Two-terminal rectifier 200 also has a body diode 220 formed by a junction between the body and the drain or by a junction between the body and the source. The body diode 220 is coupled in parallel to the source and drain of the power switch. Two-terminal rectifier 200 also has a Schottky diode 230 to the first terminal and the second terminal of the two-terminal rectifier 200.

In order to provide a DC voltage, diode rectification has been used in switching mode power supplies, for example, on the secondary side of SMPS 100 in FIG. 1. The standard diode often includes a diffusion junction between two semiconductor regions. However, the scaling down of semiconductor technology calls for lower voltage and larger current power supply. Active rectification or synchronous rectification involves replacing a diffusion diode with an actively controlled switching element such as a MOSFET. MOSFETs have a low resistance when conducting, known as on-resistance (RDS(on)). The MOSFETs can be made with an on-resistance as low as 10 mΩ or even lower. The voltage drop across the transistor is then much lower, leading to a reduction in power loss and a gain in efficiency. To further reduce the on-resistance, a parallel combination of several MOSFETs or a device with a larger active area can be used.

The control circuitry for active rectification usually uses comparators to sense the voltage of the input voltage and open the transistors at the correct times to allow current to flow in the correct direction. A snubber capacitor is often used with an active rectifier for the rectification operation. Using active rectifiers rather than standard diodes can reduce power dissipation, improve efficiency, and reduce the size and weight of the circuit the heat sink required to deal with that power dissipation.

In FIG. 2, two-terminal rectifier 200, can provide rectification by power MOSFET 210, a logic control circuit 270, and a driver circuit 280. Power MOSFET 210 also has a built-in body diode 220. In a power MOSFET, if the body and source are coupled together as shown in FIG. 2, the body and the drain form a diode between the drain (cathode) and the source (anode) of the MOSFET, making it able to block current in only one direction. Similarly, if the body and drain are coupled together, the body and the source form a diode, making it able to block current in the other direction.

In a switching cycle of SMPS 100, when the primary switching device is turned off, a current flows through the parasitic body diode of the power MOSFET before the synchronous rectifier circuit responds to turn on the MOSFET, creating a voltage drop 0.7~1.2V across the MOSFET's drain and source terminals. This voltage difference is sensed by the inputs of the logic control circuit 270, which turns on the MOSFET. After the turning on of the MOSFET, the majority of the current in the secondary winding will flow through the MOSFET, while the body diode is bypassed. The voltage drop across the MOSFET can be less than 0.2V due to a small on resistance $R_{DS}(on)$. As the current in the secondary winding decreases, the voltage across the MOSFET also decreases. When the voltage across the MOSFET has dropped to a certain preset threshold voltage, the synchronous control circuit switches off the MOSFET. Thus, a switching cycle can be repeated.

When sufficient forward voltage is applied, a current flows in the forward direction. A silicon diode has a typical forward voltage of 600-700 mV. When switching from the conducting to the blocking state, the body diode has stored charge that must first be discharged before the diode blocks reverse current. This discharge takes a finite amount of time known as the reverse recovery time, or Trr. The body diode forward voltage can cause power loss, and the reverse recovery time can lead to delay in the switching speed. Both of these problems can be alleviated by attaching a Schottky diode in parallel with the body diode.

As shown in FIG. 2, Schottky diode 230 is disposed in parallel with body diode 220 between terminals 201 and 202 of the two-terminal rectifier 200. The Schottky diode 230, also known as Schottky barrier diode, is a semiconductor diode formed by the junction of a semiconductor with a metal. It has a low forward voltage drop and fast switching action. For example, a Schottky diode can have a forward voltage that can be 150-450 mV. This lower forward voltage requirement allows higher switching speeds and better system efficiency than a conventional diffusion diode, or body diode. A difference between the p-n diode, such as the body diode, and the Schottky diode is the reverse recovery time (Trr), when the diode switches from the conducting to the non-conducting state. In a p-n diode, the reverse recovery time can be in the order of several microseconds to less than 100 ns for fast diodes. A Schottky diode is a majority carrier device and has little recovery time. The switching time can be on the order of ~100 ps for the small-signal diodes, and up to tens of nanoseconds for special high-capacity power diodes. Because of a Schottky diode's low forward voltage drop, less energy is wasted as heat, making it the most efficient choice for applications sensitive to efficiency.

As shown in FIG. 2, two-terminal rectifier 200 also has a power management circuit 250 coupled to the first terminal 201 and a capacitor 260 coupled to the power management circuit 250 and the second terminal 202. Power management circuit 250 and capacitor 260 provide power to the circuit components in the two-terminal rectifier 200. The control circuit 270 is coupled to the power management circuit 250 to receive operating power. The control circuit provides a control signal 272 for controlling an on/off state of the power switch 210 in response to a voltage condition of two terminals of the power switch. Two-terminal rectifier 200 also has a driver circuit 280 coupled to the control circuit 270 to receive the control signal 272 and to provide a driving signal 282 to the power switch 210.

Power management circuit 250 is coupled to the first terminal 201. Power management circuit 250, together with capacitor 260, provides power to the various circuit blocks in two-terminal rectifier 200. For example, when the power switch 210 in the two-terminal rectifier on the secondary side is turned off, the voltage at terminal 201 is higher than the voltage at terminal 202. The power management circuit 250 can direct the current to charge capacitor 260. When the power switch 210 in the two-terminal rectifier on the secondary side is turned on, capacitor 260 can supply energy to logical control circuit 270 and driver circuit 280. Power management circuit 250 can also include a voltage control circuit (not shown) to maintain a desired supply voltage to the circuit blocks.

Control circuit 270, labeled logic control circuit in FIG. 2, is coupled to the power management circuit 250 to receive operating power, and provides a control signal 272 for controlling an on/off state of the power switch 210 in response to a voltage condition of two terminals, the source terminal 211 and the drain terminal 212, of the power switch. Control circuit 270 can monitor the voltage difference between the source and drain terminals of the MOSFET, and compare the voltage difference with a reference voltage to respond either before or after the voltage across the drain and source terminals of the MOSFET drops to zero, thereby preventing the back flow of current and reducing power loss. Drive circuit 280 can provide a driving circuit to quickly switch the MOSFET. Drive circuit 280 can include amplifiers and supporting components.

This invention teaches a two-terminal rectifier that includes a power MOSFET, a Schottky diode, a capacitor, power management and control circuitry in a single package. The package design can reduce parasitic inductance, capacitance, and resistance between components. Implementing these circuit components in a two-terminal device can simplify power converter system design. The two-terminal rectifier can be used as a two-terminal drop-in replacement for a conventional diffusion diode or a conventional synchronous rectifier in a power converter. As described in more detail in a subsequent section, a simple control for CCM operation without a synchronization signal is also described.

Figure 3:
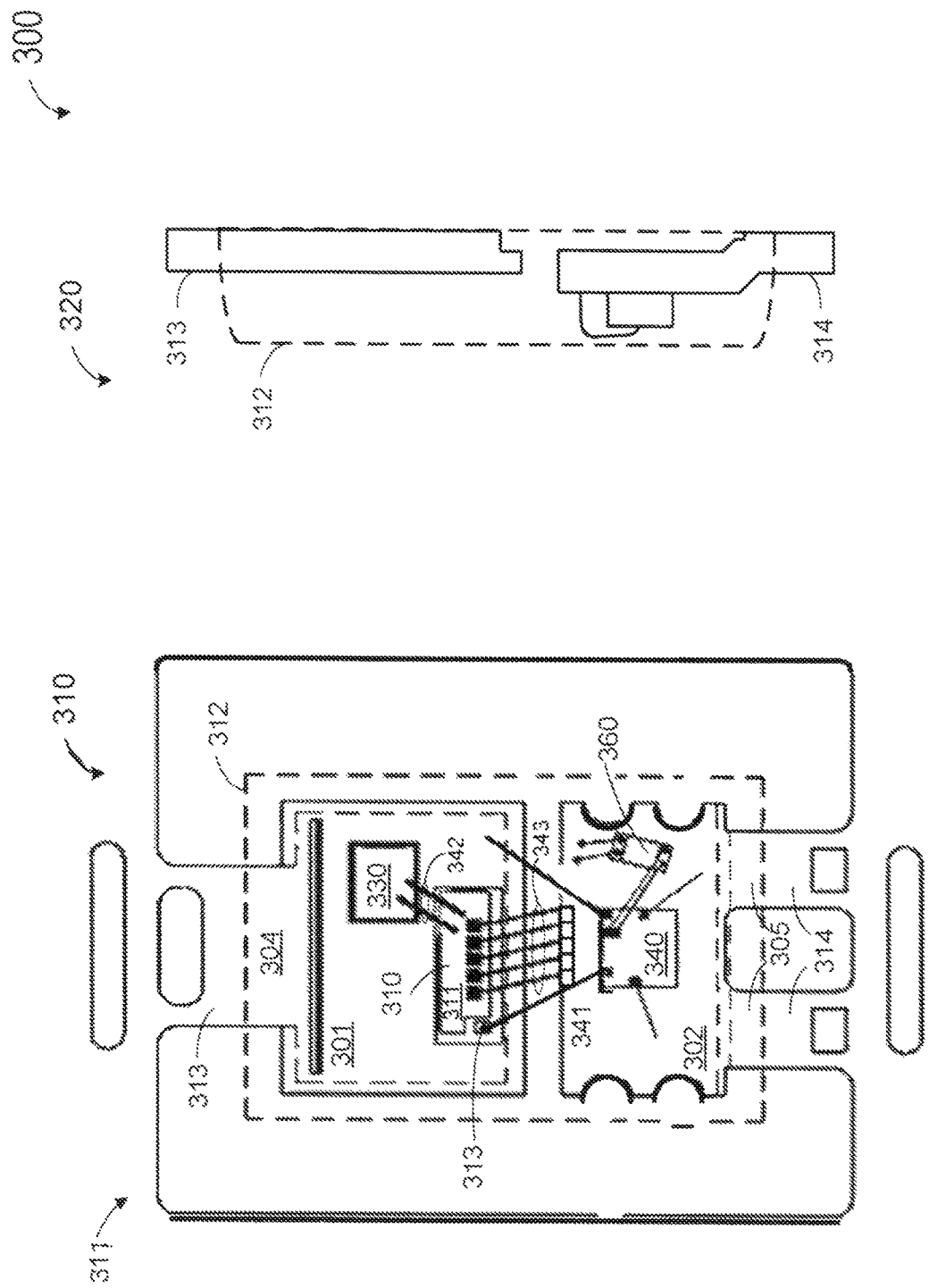
FIG. 3 is a top-view layout diagram and a side view cross-sectional diagram of a two-pin package that embodies certain aspects of this invention.

FIG. 3 is a top-view layout diagram and a side view cross-sectional diagram for a two-pin package that embodies certain aspects of this invention. In FIG. 3, diagram 310 is a top-view layout diagram, and diagram 320 is a side view cross-sectional diagram of the two-terminal rectifier 300 in a two-pin package. Diagram 310 shows a portion of a leadframe 311 before being trimmed into individual packages. Diagram 320 is a side view cross-sectional diagram of the package. As shown in FIG. 3, two-terminal rectifier 300 in a package includes an encapsulation 312 of a mold material, and a first pin 313 and a second pin 314 protruding out of encapsulation 312. The second pin 314 has two connectors electrically connected together.

Two-terminal rectifier 300 includes a first chip mount pad 301 and a second chip mount pad 302. A first lead segment 304 is coupled to the first chip mount pad 301, and a second lead segment 305, including two pieces of conductors, is coupled to the second chip mount pad 302. In this example, two-terminal rectifier 300 can have similar circuit components as two-terminal rectifier 200 in FIG. 2. A first semiconductor chip 310 includes a power switch, which can be similar to power switch 210 in FIG. 2. As shown in FIG. 3, the first semiconductor chip 310 is attached to the first chip mount pad 301. The drain of power switch 310, which can be at the bottom of power switch chip 310 and not shown in FIG. 3, can be coupled to the first lead segment 304 through the first chip mount pad 301. A second semiconductor chip 330 includes a Schottky diode, which can be similar to Schottky diode 230 in FIG. 2. The second semiconductor chip 330 is attached to the first chip mount pad 301. A cathode of the Schottky diode is connected to the drain at the bottom of power switch chip 310 and not shown in FIG. 3, can be coupled to the first lead segment 304 through the first chip mount pad 301.

A third semiconductor chip 340 can be attached to the second chip mount pad 302. The third semiconductor chip 340 can include a power management circuit, a control circuit, and a driver circuit, which can be similar to power management circuit 250, control circuit 270, and driver circuit 280 in FIG. 2. A capacitor 360, which can be similar to capacitor 260 in FIG. 2, is attached to the second chip mount pad 302. A first end of the capacitor 360 is coupled to second lead segment 305 through the second chip mount pad 302, and a second end of the capacitor is coupled to the power management circuit in the third semiconductor chip 340. A first conductive connection 341 couples an output pin of the third semiconductor chip 340 to the gate 313 of the power switch. A second conductive connection 342 couples a cathode of the Schottky diode to source 311 of power switch chip 310. A third conductive connection 343, shown as five conductions in FIG. 3, connects the source 311 of the power switch 310 to the second chip mount pad 302.

The encapsulation 312 in the two-terminal rectifier 300 encapsulates the first, second, third semiconductor chips and the capacitor, the first and second chip mount pads, and portions of the first and second lead segments. In some examples, the encapsulation exposes a bottom surface of the first chip mount pad 301.

A switch mode power supply (SMPS), such as SMPS 100 illustrated in FIG. 1, can operate in continuous conduction mode (CCM) or discontinuous conduction mode (DCM). In the operation of SMPS 100, as described above in connection with FIG. 1, the primary side controller circuit QP is configured to turn on and turn off power transistor M1 to regulate the SMPS. When power transistor M1 is turned on, a primary current Ip builds in primary winding Np, which stores energy. The energy stored in primary winding Np is transferred to secondary winding Ns to induce a secondary current Is during a turn-off time interval of power transistor M1. In CCM, the system turns on the primary side before secondary side current is stopped. In DCM, there exists a discontinuous time period, in which the current flow is stopped on both the primary side and the secondary side.

The CCM operation can have many advantages over DCM operations. For example, the voltage gain is not dependent of the load, the input current is continuous and not pulsating, and the ripple component of the inductor current can be lower than the average component. Further, in CCM operation, higher efficiencies can be achieved in comparison with DCM. In contrast, in DCM operation, the voltage gain depends on the load and design parameters, the input current is pulsating, and the ripple component of the inductor current is higher and its RMS value is higher. However, the size of the inductor can be reduced in comparison with CCM.

Further, the same converter can operate in both modes. For example, in order to obtain a regulated output voltage, the mode can be defined by the power load and the input voltage. For example, at low load, the duty cycle is low, and the power supply can operate in DCM. In contrast, at high load, the duty cycle is higher, and the power supply can operate in CCM. The control function for DCM can be simpler, with a single-pole transfer function. However, the control function for CCM can be more complicated, needing a double-pole transfer function. Converters with only single pole transfer functions are easier to compensate than converters having a double pole response. Some conventional converters implement the CCM operation with additional communication between the primary side and the secondary side. For example, the secondary side can have a synchronous pin for receiving a turn-off signal from the primary side. In another example, the secondary side controller can signal to the primary side controller indicating that the secondary side is turned off. These additional design considerations can increase system complexity and cost.

This invention teaches a two-terminal rectifier that includes a power MOSFET, a Schottky diode, a capacitor, and control circuitry in a single package. The two-terminal rectifier can be used as a two-terminal drop-in replacement for a conventional diffusion diode or a conventional synchronous rectifier in a power converter. A simple control for CCM operation is also described. The advantages of using the two-terminal rectifier described above are illustrated in reference to FIGS. 4-7.

Figure 4:
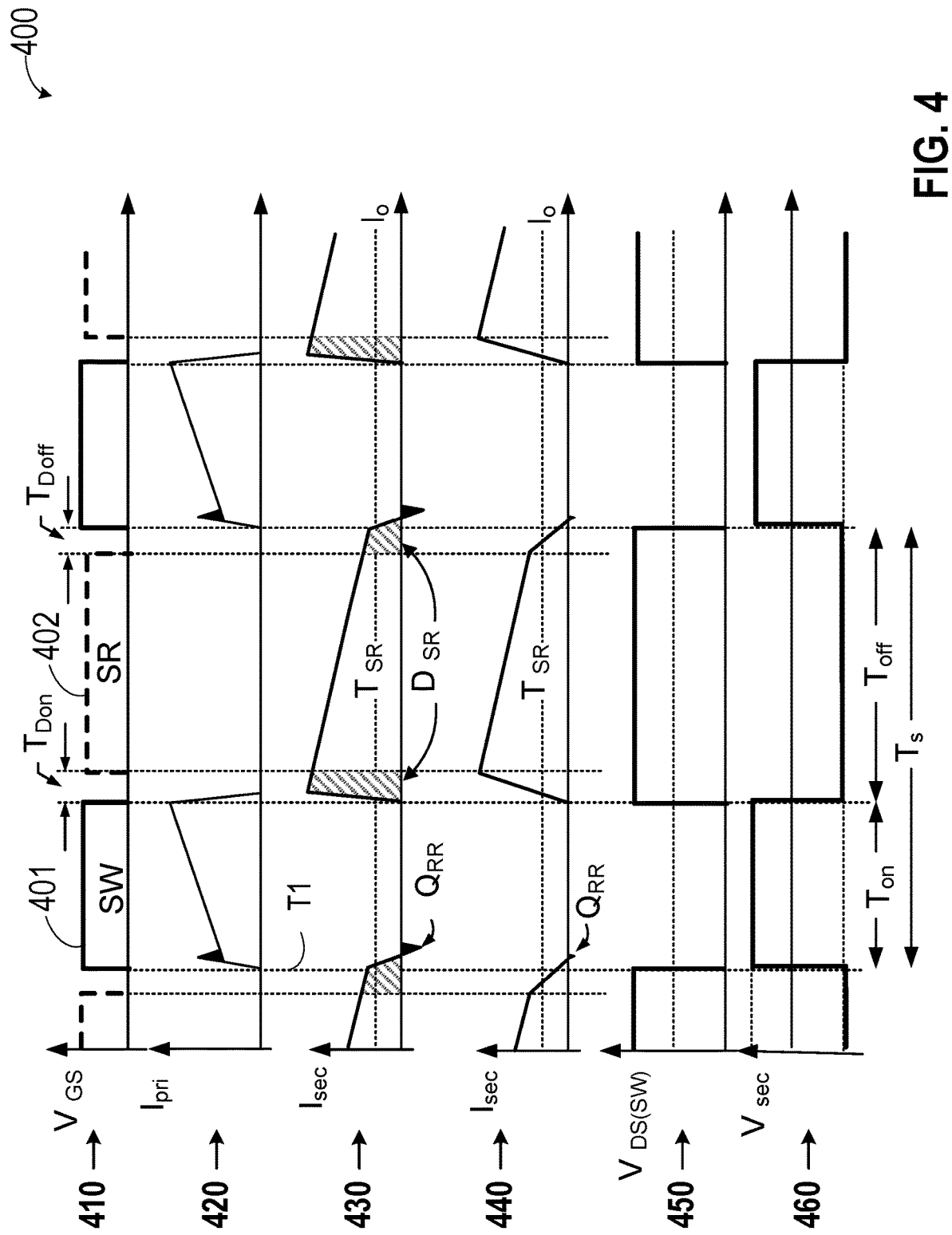
FIG. 4 is a waveform diagram illustrating the operation of a power converter that embodies certain aspects of this invention.

FIG. 4 is a waveform diagram illustrating the operation of a power converter that embodies certain aspects of this invention. FIG. 4 illustrates waveforms of various parameters during a switching cycle of a power converter, similar to power converter 100 in FIG. 1. As shown in FIG. 4, in graph 410, VGS denotes gate-source voltages of power MOSFETs on the primary side and the secondary side. The solid curve 401 (marked with SW) illustrates the gate-source voltage of the power MOSFET on the primary side as a result of control signals provided to the gate of the power switch M1 on the primary side in FIG. 1. The dashed curve 402 (marked with SR) illustrates the gate-source voltage of the power MOSFET in the two-terminal rectifier 110 on the secondary side.

In graph 420 of FIG. 4, $I_{pri}$ illustrates the current in the primary winding of the transformer. Two graphs, 430 and 440, illustrate the current in the secondary winding $I_{sec}$ of the transformer for two different rectifiers, as explained below. In graph 450, VDS(SW) illustrates the drain-source voltage of power switch on the primary side, for example, power switch M1 in FIG. 1. In graph 460, $V_{sec}$ illustrates the waveform across the cathode K (210) and the anode A (202).

In FIG. 4, the switching cycle is marked by time duration Ts, which includes durations Ton, and Toff. During Ton, the control signal to the primary side power switch in on, and during Toff, the control signal to the primary side power switch is off. In the VGS graph 410, during time Ton, the primary side MOSFET is turned on as shown by VGS curve 401, and during time Toff, the secondary side MOSFET is turned on as shown by VGS curve 402. The driving current to the primary side power switch is applied during time Ton. In graph 420, current $I_{pri}$ in the primary winding increases linearly from zero to a peak value until power switch M1 is turned off by the primary side controller. At this time, the secondary winding current $I_{sec}$ increases abruptly.

Graph 430 illustrates the secondary current $I_{sec}$ when rectifier on the secondary side is a conventional synchronous rectifier. Before the rectifier responds to turn on the power MOSFET, the current flows through the parasitic body diode of the power MOSFET, creating a voltage drop of about 0.7~1.2V across the drain and source terminals. After the power MOSFET is turned on by the synchronous control circuit, the current from the secondary winding flows through the power MOSFET, bypassing the body diode. The voltage drop across the power MOSFET decreases to, e. g., about 0.2V or less, due to a small on-resistance $R_{DS}(on)$. With the current decreasing linearly in the secondary winding, the voltage across the power MOSFET also decreases.

When the voltage across the power MOSFET drops to a reference voltage, the synchronous control circuit switches off the power MOSFET. At the beginning of the next switching cycle, the primary side power switch is turned on again by the primary side power controller, and the switching cycle is repeated.

It is noted that in the continuous conduction mode (CCM) operation, the primary current starts to increase, before the secondary current is reduced to zero. Further, during time durations $T_{Don}$ and $T_{Doff}$, also known as dead time, both the primary and the secondary switches are turned off, and the current flows through the body diodes in the rectifier. In FIG. 4, the highlighted areas in graph 430 indicate current flow through the body diode in a conventional synchronous rectifier. The stored charges (Qrr) need to be discharged, which takes a finite amount of time known as reverse recovery time. These limitations have led to complicated control circuits in CCM operations in a power converter with a conventional secondary side synchronous rectifier. The control circuits often involve communication between the primary side and the secondary side to coordinate the timing of turning on and off of the primary side power MOSFET and secondary side power MOSFET.

Graph 440 in FIG. 4 illustrates the secondary current $I_{sec}$ when the rectifier on the secondary side is the two-terminal rectifier described in connection with FIGS. 1-3. The two-terminal rectifier includes a power MOSFET and a Schottky diode in the same package, along with other components. It can be seen that the current conduction in the body diodes and the reverse recovery charges are substantially reduced. These features can enable CCM operation using the two-terminal rectifier. In some cases, a simple control method for CCM operation can be achieved, without hand-shake arrangement, e.g., a CCM synchronization signal, between the primary side and the secondary side. In some conventional systems, the hand-shake arrangement may involve an extra sync pin on the secondary side controller, and can increase the complexity and cost of the system.

Figure 5:
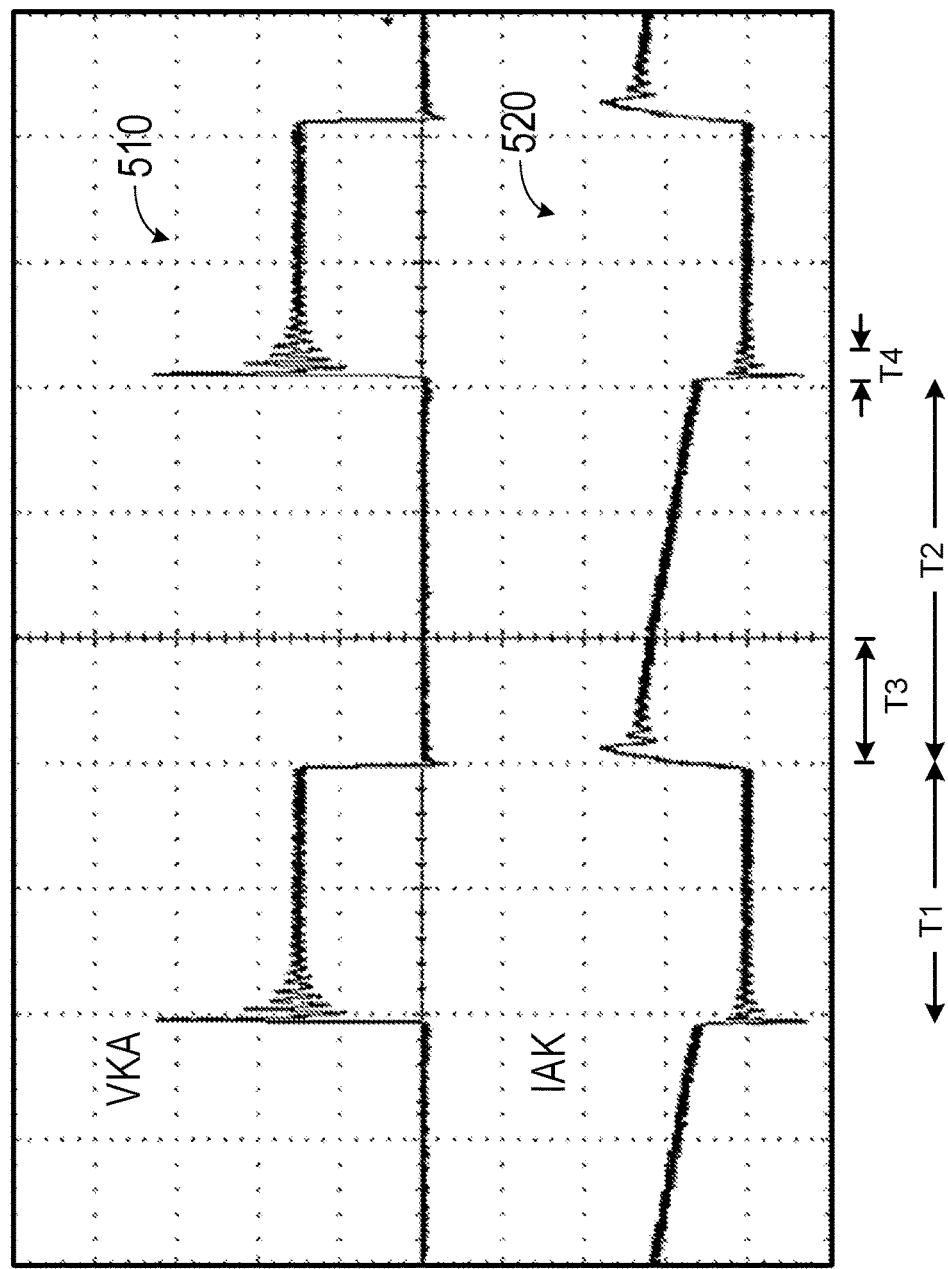
FIG. 5 is a waveform diagram 500 illustrating drain-source voltage and current in a rectifier having a synchronous MOSFET in a power converter.
Figure 6:
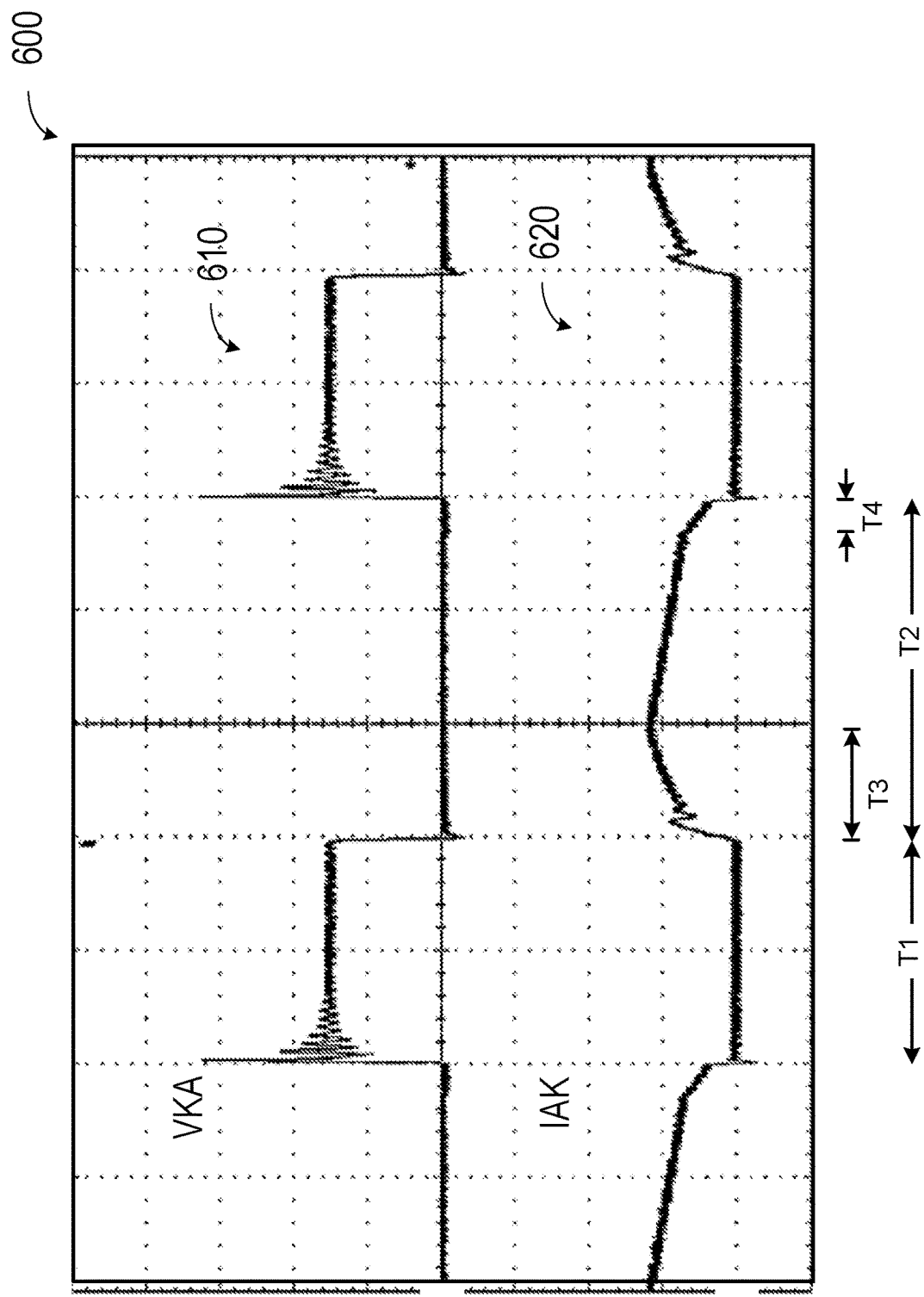
FIG. 6 is a waveform diagram illustrating drain-source voltage and current in a two-terminal rectifier having a synchronous MOSFET connected in parallel with a Schottky diode in a power converter.
Figure 7:
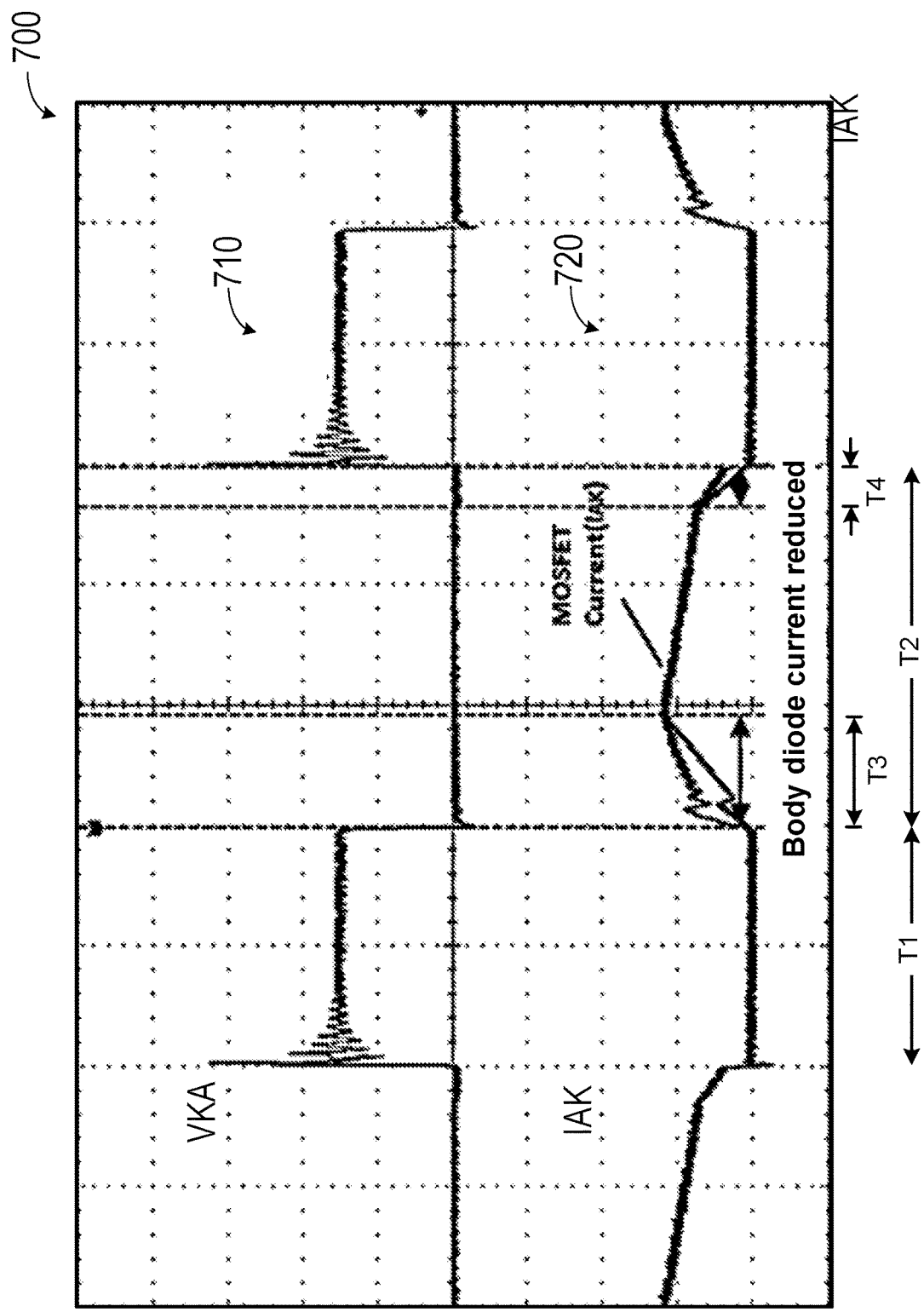
FIG. 7 is a waveform diagram illustrating drain-source voltage and current in the two-terminal rectifier in a power converter that embodies certain aspects of this invention.

FIG. 5 to FIG. 7 are waveform diagrams illustrating voltage and current in a two-terminal rectifier that embodies certain aspects of this invention.

FIG. 5 is a waveform diagram 500 illustrating drain-source voltage and current in a rectifier having a synchronous MOSFET in a power converter such as power converter 100 in FIG. 1. FIG. 5 plots the drain-source voltage (VKA) 510 and the MOSFET current (IAK) 520 of the rectifier during switching cycles. For example, during time T1, the primary current is on, and the secondary current is off. Therefore, the secondary side rectifier is turned off and not conducting. As a result, VKA is high, and IAK is zero. During time T2, the primary current is off, and the secondary current is on. Therefore, the secondary side rectifier is turned on and conducting. As a result, VKA is low, and IAK is not zero. During transitions, for example, during times T3 and T4, current flows in the body diode, which can cause voltage ringing and current spikes.

FIG. 6 is a waveform diagram 600 illustrating drain-source voltage and current in a two-terminal rectifier having a synchronous MOSFET connected in parallel with a Schottky diode in a power converter such as power converter 100 in FIG. 1. In this example, the rectifier has a synchronous MOSFET connected in parallel with a Schottky diode in two separate semiconductor chip packages. The connections include short and thicker wires to reduce parasitic components, such as wiring inductance and resistance, etc.

FIG. 6 plots the drain-source voltage (VKA) 610 and the MOSFET current (IAK) 620 of the rectifier during switching cycles. For example, during time T1, the primary current is on, and the secondary current is off. Therefore, the secondary side rectifier is turned off and not conducting. As a result, VKA is high, and IAK is zero. During time T2, the primary current is off, and the secondary current is on. Therefore, the secondary side rectifier is turned on and conducting. As a result, VKA is low, and IAK is not zero. During transitions, for example, during times T3 and T4, current flows in the body diode, which can cause voltage ringing and current spikes. It can be seen that the body diode current and reverse current in time period T3 and T4 in FIG. 6 are reduced, compared with the plots in FIG. 5.

FIG. 7 is a waveform diagram 700 illustrating drain-source voltage and current in the two-terminal rectifier that embodies certain aspects of this invention. In this example, the two-terminal rectifier is similar to those described above in connection to FIGS. 2 and 3 in a power converter such as power converter 100 in FIG. 1. The two-terminal rectifier includes a power MOSFET and a Schottky diode, as well as the control function circuits described above, in a single package. FIG. 7 plots the drain-source voltage (VKA) 710 and the MOSFET current (IAK) 720 of the rectifier during switching cycles. The MOSFET current (IAK) 720 is an estimated MOSFET current with the two-terminal rectifier in a single package as described above and illustrated in FIGS. 2 and 3. In FIG. 7, the MOSFET current (IAK) 620 from FIG. 6 is superimposed over the MOSFET current (IAK) 720.

For example, during time T1, the primary current is on, and the secondary current is off. Therefore, the secondary side rectifier is turned off and not conducting. As a result, VKA is high, and IAK is zero. During time T2, the primary current is off, and the secondary current is on. Therefore, the secondary side rectifier is turned on and conducting. As a result, VKA is low, and IAK is not zero. During transitions, for example, during times T3 and T4, current flows in the body diode, which can cause voltage ringing and current spikes. It can be seen that the body diode current and reverse current in time period T3 and T4 in FIG. 7 are reduced, compared with the plots in FIG. 6. Furthermore, the thermal efficiency of the system can also be improved.

Figure 8:
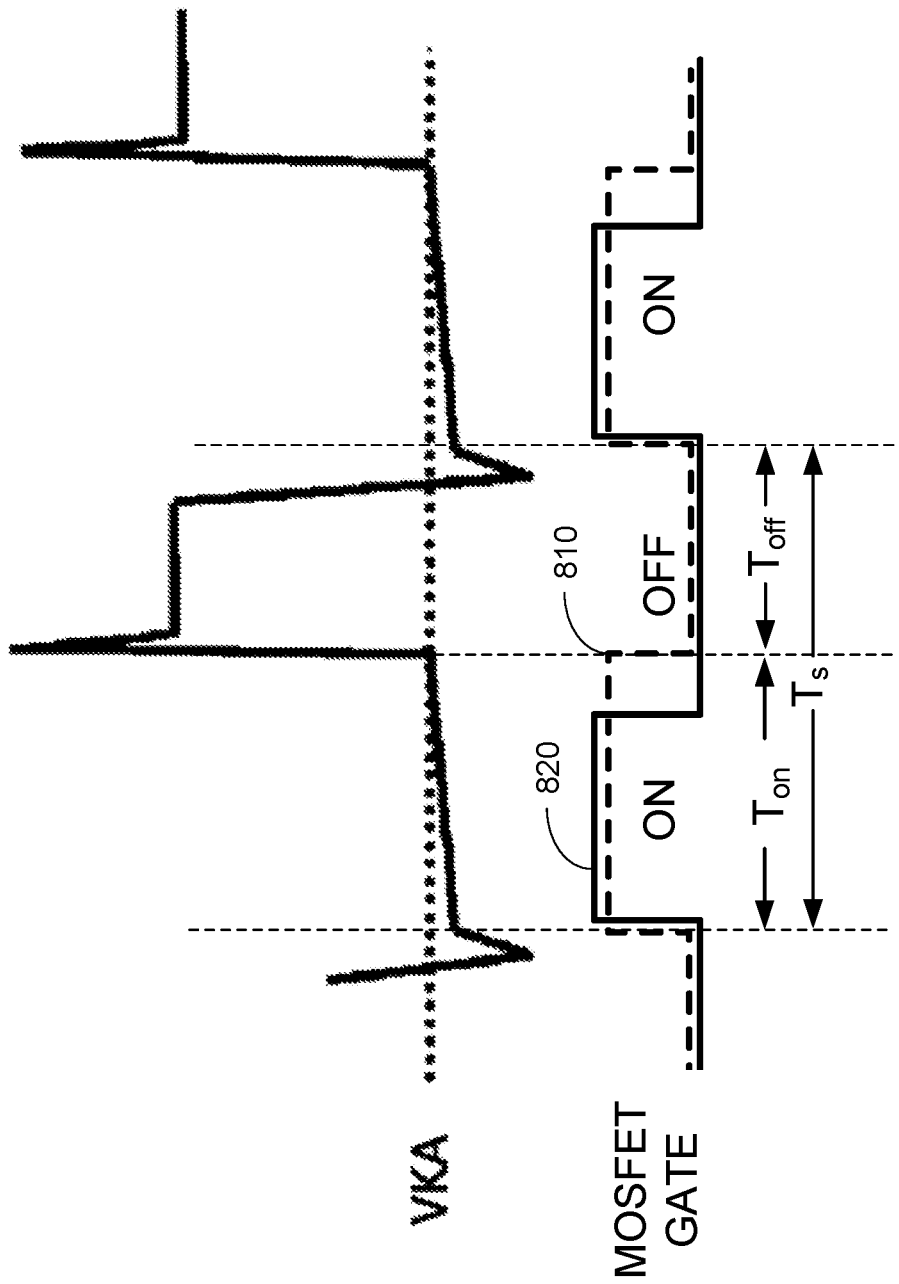
FIG. 8 is a waveform diagram illustrating a method for operating a flyback power converter in CCM operation using the two-terminal rectifier that embodies certain aspects of this invention.

FIG. 8 is a waveform diagram illustrating a method for operating a flyback power converter in CCM operation using the two-terminal rectifier described above. In FIG. 8, waveforms labeled "MOSFET GATE" illustrate gate voltage of the power MOSFET in the rectifier during a switching cycle Ts. Wave form 810 illustrates the control signal applied to the gate of the MOSFET in a conventional rectifier. It can be seen that in a switching cycle of a conventional rectifier, the rectifier is turned on during time Ton and turned off during time Toff. The waveform VKA depicts the variation of voltage between the cathode (K) and the anode (A) of the secondary rectifier during a switching cycle Ts. As described above, in a conventional CCM operation in a flyback power supply, complicated control circuits are needed and involving handshaking signal handling between the primary and secondary side.

In FIG. 8, waveform 820 illustrates the control signal on the gate of the power MOSFET in the two-terminal rectifier for CCM operation for a flyback power converter. After the primary side current flow is turned off, the secondary current flows through the body diode and the Schottky diode. When the voltage VKA between the cathode (K) and anode (A) in the two-terminal rectifier is lower than a preset value, the two-terminal rectifier is turned on to start the secondary inductor discharge cycle Ton. When the voltage between the cathode (K) and the anode (A) of the two-terminal rectifier is less than a pre-set reference voltage, the power MOSFET is turned off. The pre-set reference voltage is selected to maintain proper current flow. The two-terminal rectifier can reduce body diode current conduction during a dead time in the power converter and to reduce reverse recover time of the body diode. In the two-terminal rectifier, the control circuit can adjust a dead time for continuous conduction mode (CCM) operation of the power converter. During the off time Toff, the primary side is turned on to enable CCM operations. Thus, compared with the conventional control signal 810, the two-terminal rectifier control signal 820 in this embodiment has a shorter ON time and a longer OFF time. Further, the CCM operation can be implemented using a two-terminal rectifier with the simpler DCM control design, without a CCM synchronization signal. In some cases, the On time and Off time can be determined empirically or using simulation techniques.

What is claimed is:

1. A two-terminal rectifier, comprising:
   a first terminal and a second terminal configured for coupling between a transformer and an output terminal of a power converter;
   a power switch coupled to the first terminal and the second terminal for turning on and off current flow between the first terminal and the second terminal, wherein the power switch comprises a power MOSFET having a source, a drain, a gate, and a body;
   a body diode formed by a junction between the body and the drain of the power MOSFET or by a junction between the body and the source of the power MOSFET, the body diode being coupled in parallel to the source and drain of the power switch;
   a Schottky diode coupled to the first terminal and the second terminal;
   a power management circuit and a capacitor coupled between the first terminal and the second terminal, and being configured to provide operating power to the two-terminal rectifier;
   a control circuit coupled to the power management circuit and configured to provide a control signal for controlling an on/off state of the power MOSFET in response to a voltage between the drain and the source of the power switch; and
   a driver circuit coupled to the control circuit to receive the control signal and to provide a driving signal to the gate of the power MOSFET;
   wherein the two-terminal rectifier is configured to reduce body diode current conduction during a dead time in the power converter and to reduce reverse recover time in the body diode,
   wherein the two-terminal rectifier is configured for continuous conduction mode (CCM) operation of the power converter without a synchronization signal.

2. The two-terminal rectifier of claim 1, wherein the two-terminal rectifier is coupled to a secondary side of the power converter.

3. The two-terminal rectifier of claim 2, wherein the control circuit is configured to adjust the dead time for continuous conduction mode (CCM) operation of the power converter, wherein during the dead time a power switch on a primary side of the power converter and the power MOSFET in the two-terminal rectifier on the secondary side of the power converter are off.

4. The two-terminal rectifier of claim 1, further comprising:

a first chip mount pad and a second chip mount pad;
a first lead segment coupled to the first chip mount pad;
a second lead segment coupled to the second chip mount pad;
a first semiconductor chip comprising the power switch attached to the first chip mount pad, the drain of the power switch coupled to the first lead segment through the first chip mount pad;
a second semiconductor chip comprising the Schottky diode attached to the first chip mount pad, a cathode of the Schottky diode coupled to the first lead segment through the first chip mount pad;
a third semiconductor chip comprising the power management circuit, the control circuit, and the driver circuit, the third semiconductor chip attached to the second chip mount pad;
the capacitor attached to the second chip mount pad, a first end of the capacitor coupled to the second lead segment through the second chip mount pad, a second end of the capacitor coupled to the power management circuit in the third semiconductor chip;
a first conductive connection coupling an output pin of the third semiconductor chip to the gate of the power switch;
a second conductive connection coupling an anode of the Schottky diode to the source of the power switch; and
a third conductive connection connecting the source of the power switch to the second chip mount pad.

5. The two-terminal rectifier of claim 4, further comprising an encapsulation of a mold material encapsulating the first, second, third semiconductor chips and the capacitor, the first and second chip mount pads, and portions of the first and second lead segments.

6. The two-terminal rectifier of claim 5, wherein the encapsulation exposes a bottom surface of the first chip mount pad.

7. The two-terminal rectifier of claim 4, wherein the first and second chip mount pads and the first and second lead segments are portions of a leadframe.

8. The two-terminal rectifier of claim 1, wherein the first terminal of the two-terminal rectifier is coupled to an anode of the Schottky diode, and the second terminal is coupled to a cathode of the Schottky diode.

9. A two-terminal rectifier, comprising:
a first terminal and a second terminal configured for coupling between a transformer and an output terminal of a power converter;
a power switch coupled to the first terminal and the second terminal for turning on and off current flow between the first terminal and the second terminal, wherein the power switch comprises a power MOSFET having a source, a drain, a gate, and a body;
a body diode formed by a junction between the body and the drain of the power MOSFET or by a junction between the body and the source of the power MOSFET, the body diode being coupled in parallel to the source and drain of the power switch;
a Schottky diode coupled to the first terminal and the second terminal;
a power management circuit and a capacitor coupled between the first terminal and the second terminal, and being configured to provide operating power to the two-terminal rectifier;
a control circuit coupled to the power management circuit and configured to provide a control signal for controlling an on/off state of the power MOSFET in response to a voltage between the drain and the source of the power switch; and
a driver circuit coupled to the control circuit to receive the control signal and to provide a driving signal to the gate of the power MOSFET;
wherein the two-terminal rectifier is configured to reduce body diode current conduction during a dead time in the power converter and to reduce reverse recover time in the body diode.

10. The two-terminal rectifier of claim 9, wherein the two-terminal rectifier is coupled to a secondary side of the power converter.

11. The two-terminal rectifier of claim 10, wherein the control circuit is configured to adjust the dead time during which a power switch on a primary side of the power converter and the power MOSFET in the two-terminal rectifier on the secondary side of the power converter are off.

12. The two-terminal rectifier of claim 9, further comprising:
a first chip mount pad and a second chip mount pad;
a first lead segment coupled to the first chip mount pad;
a second lead segment coupled to the second chip mount pad;
a first semiconductor chip comprising the power switch attached to the first chip mount pad, the drain of the power switch coupled to the first lead segment through the first chip mount pad;
a second semiconductor chip comprising the Schottky diode attached to the first chip mount pad, a cathode of the Schottky diode coupled to the first lead segment through the first chip mount pad;
a third semiconductor chip comprising the power management circuit, the control circuit, and the driver circuit, the third semiconductor chip attached to the second chip mount pad;
the capacitor attached to the second chip mount pad, a first end of the capacitor coupled to second lead segment through the second chip mount pad, a second end of the capacitor coupled to the power management circuit in the third semiconductor chip;
a first conductive connection coupling an output pin of the third semiconductor chip to the gate of the power switch;
a second conductive connection coupling an anode of the Schottky diode to the second chip mount pad; and
a third conductive connection connecting the source of the power switch to the second chip mount pad.

13. The two-terminal rectifier of claim 12, further comprising an encapsulation of a mold material, encapsulating the first, second, third semiconductor chips and the capacitor, the first and second chip mount pads, and portions of the first and second lead segments.

14. A power converter having a two-terminal rectifier, the power converter comprising:
a transformer with a primary winding for receiving a DC input voltage and a secondary winding for providing an output to an output capacitor;
a power switch coupled to the primary winding of the transformer;
a primary-side controller coupled to the power switch, the primary-side controller being configured to control the power switch for turning on and turning off a current flow in the primary winding, and
a two-terminal rectifier coupled to the secondary winding of the transformer and the output capacitor, the two-terminal rectifier configured to adjust a dead time for continuous conduction mode (CCM) operation of the power converter;

wherein the two-terminal rectifier comprises:
- a first terminal and a second terminal configured for coupling between the transformer and an output terminal of the power converter; and
- a power management circuit and a capacitor coupled between the first terminal and the second terminal, and being configured to provide operating power to the two-terminal rectifier, such that the two-terminal rectifier is without an additional power supply terminal:

wherein the two-terminal rectifier further comprises:
- a power switch coupled to the first terminal and the second terminal for turning on and off current flow between the first terminal and the second terminal, wherein the power switch comprises a power MOSFET having a source, a drain, a gate, and a body;
- a body diode formed by a junction between the body and the drain of the power MOSFET or by a junction between the body and the source of the power MOSFET, the body diode being coupled in parallel to the source and drain of the power switch;
- a Schottky diode coupled to the first terminal and the second terminal;
- a control circuit coupled to the power management circuit and configured to provide a control signal for controlling an on/off state of the power MOSFET in response to a voltage between the drain and the source of the power switch; and
- a driver circuit coupled to the control circuit to receive the control signal and to provide a driving signal to the gate of the power MOSFET.

15. The power converter of claim 14, wherein the two-terminal rectifier comprises:
- a first chip mount pad and a second chip mount pad;
- a first lead segment coupled to the first chip mount pad;
- a second lead segment coupled to the second chip mount pad;
- a first semiconductor chip comprising the power switch attached to the first chip mount pad, the drain of the power switch coupled to the first lead segment through the first chip mount pad;
- a second semiconductor chip comprising the Schottky diode attached to the first chip mount pad, a cathode of the Schottky diode coupled to the first lead segment through the first chip mount pad;
- a third semiconductor chip comprising the power management circuit, the control circuit, and the driver circuit, the third semiconductor chip attached to the second chip mount pad;
- the capacitor attached to the second chip mount pad, a first end of the capacitor coupled to second lead segment through the second chip mount pad, a second end of the capacitor coupled to the power management circuit in the third semiconductor chip;
- a first conductive connection coupling an output pin of the third semiconductor chip to the gate of the power switch;
- a second conductive connection coupling an anode of the Schottky diode to the second chip mount pad; and
- a third conductive connection connecting the source of the power switch to the second chip mount pad.

16. The power converter of claim 15, wherein the two-terminal rectifier further comprises an encapsulation of a mold material encapsulating the first, second, and third semiconductor chips and the capacitor, the first and second chip mount pads, and portions of the first and second lead segments.

17. The power converter of claim 14, wherein the first terminal of the two-terminal rectifier is coupled to an anode of the Schottky diode, and the second terminal is coupled to a cathode of the Schottky diode.

18. The two-terminal rectifier of claim 14, wherein the two-terminal rectifier is configured for continuous conduction mode (CCM) operation of the power converter without a synchronization signal.

* * * * *